(12) United States Patent
Lin (10) Patent No.: US 10,462,930 B2
(45) Date of Patent: Oct. 29, 2019

(54) FAN DEVICE AND ELECTRONIC DEVICE

(71) Applicant: Qisda Corporation, Taoyuan County (TW)

(72) Inventor: Chi-Cheng Lin, Taoyuan County (TW)

(73) Assignee: Qisda Corporation, Taoyuan (TW)

( * ) Notice: Subject to any disclaimer, the term of this patent is extended or adjusted under 35 U.S.C. 154(b) by 540 days.

(21) Appl. No.: 15/017,718

(22) Filed: Feb. 8, 2016

(65) Prior Publication Data
US 2016/0242316 A1    Aug. 18, 2016

(30) Foreign Application Priority Data

Feb. 13, 2015 (TW) .............................. 104105117 A (51) Int. Cl.
*H05K 7/20* (2006.01)
*F04D 25/06* (2006.01)
(Continued)

(52) U.S. Cl.
CPC ......... *H05K 7/20172* (2013.01); *F04D 17/16* (2013.01); *F04D 25/062* (2013.01); *F04D 29/626* (2013.01); *F05D 2260/32* (2013.01)

(58) Field of Classification Search
CPC .. F04D 29/582; F04D 25/0613; F04D 25/064; F04D 25/0646; F04D 25/0653; F04D 29/281; F04D 29/584; F04D 29/601; F04D 19/002; F04D 25/062; F04D 29/626; H05K 7/20172; H02K 11/33; H02K 49/108; H02K 7/14; F05D 2260/32; Y10S 310/06
See application file for complete search history.

(56) References Cited

U.S. PATENT DOCUMENTS 5,484,013 A    1/1996 Morikawa et al.
5,810,554 A *  9/1998 Yokozawa ............ F04D 29/582
                                                    415/176
(Continued)

FOREIGN PATENT DOCUMENTS

CN    2586832 Y    11/2003
CN    101446294 A   6/2009
(Continued)

OTHER PUBLICATIONS

Office action of counterpart application by Taiwan IP office dated Dec. 21, 2015.
(Continued)

*Primary Examiner* — Dominick L Plakkoottam (57) ABSTRACT

A fan device includes a casing, a stator unit disposed inside the casing, a rotor unit disposed outside the casing corresponding to the stator unit, and a bearing support detachably connected to the casing. The rotor unit is isolated from the stator unit by the casing and includes a rotation shaft, a bearing, a fan wheel, and a rotor. The bearing support partially shields the rotor unit and supports the rotor unit in a manner that the bearing or the rotation shaft is fixed to the bearing support, so that the fan wheel is driven to rotate with respect to the bearing support as the rotor rotates relative to the stator unit, and the rotor unit and the bearing support can be removed together from the casing when the bearing support is removed from the casing.

18 Claims, 9 Drawing Sheets

(51) Int. Cl.
*F04D 29/42* (2006.01)
*F04D 29/056* (2006.01)
*F04D 29/28* (2006.01)
*F04D 17/16* (2006.01)
*F04D 29/053* (2006.01)
*F04D 29/62* (2006.01)

(56) References Cited

U.S. PATENT DOCUMENTS

| | | | | |
|---|---|---|---|---|
| 5,969,445 | A * | 10/1999 | Horiuchi | H02K 11/40 |
| | | | | 310/64 |
| 7,885,065 | B2 | 2/2011 | Kaneko et al. | |
| 9,733,681 | B2 * | 8/2017 | Eriksen | H01L 23/473 |
| 2003/0118461 | A1 * | 6/2003 | Hodapp | F04D 25/0653 |
| | | | | 417/423.7 |
| 2005/0253467 | A1 * | 11/2005 | Watanabe | F04D 29/582 |
| | | | | 310/71 |
| 2007/0104593 | A1 * | 5/2007 | Yamaguchi | F04D 29/281 |
| | | | | 417/354 |
| 2007/0110576 | A1 * | 5/2007 | Hong | F04D 25/16 |
| | | | | 415/220 |
| 2011/0073289 | A1 * | 3/2011 | Shah | F04D 25/0613 |
| | | | | 165/122 |
| 2012/0074802 | A1 * | 3/2012 | Oi | F04D 25/08 |
| | | | | 310/64 |
| 2012/0100019 | A1 * | 4/2012 | Horng | F04B 35/04 |
| | | | | 417/410.1 |
| 2012/0126644 | A1 | 5/2012 | Wu | |
| 2013/0192581 | A1 * | 8/2013 | Haefner | F04D 23/008 |
| | | | | 126/77 |
| 2014/0294621 | A1 * | 10/2014 | Narita | F04D 25/0613 |
| | | | | 417/354 |
| 2017/0367216 | A1 * | 12/2017 | Shen | H05K 7/20272 |

FOREIGN PATENT DOCUMENTS

| | | |
|---|---|---|
| CN | 202132257 U | 2/2012 |
| CN | 202775874 U | 3/2013 |
| CN | 203015353 U | 6/2013 |
| CN | 203464220 U | 3/2014 |
| JP | 2000299964 A | 10/2000 |
| TW | 317702 | 10/1997 |
| TW | 556883 U | 10/2003 |

OTHER PUBLICATIONS

Office action of counterpart application by TIPO of Taiwan dated Dec. 26, 2016.

Office action of counterpart application by SIPO of China dated Sep. 26, 2016.

\* cited by examiner

FAN DEVICE AND ELECTRONIC DEVICE

BACKGROUND OF THE INVENTION

1. Field of the Invention

The invention is related to a fan device. Particularly, the invention is related to a separable fan device and an electronic device.

2. Description of the Prior Art

The fan generally consists of a rotor, a stator, and a circuit board. The stator is electrically connected to the circuit board. By means of the bearing and the rotation shaft, the fan wheel is driven to rotate and generate air flow as the rotor rotates relative to the stator. However, such fans are generally positioned by inserting the rotation shaft through the bearing and the stator, making the assembly and disassembly of the fan be very complicated and difficult. When the fan is used in high moisture or dirty environment, the fan is not waterproof and not easy to be disassembled, so that the fan cannot be effectively cleaned, possibly resulting in damage of the stator and the circuit board.

One solution of protecting the stator and the circuit board which are sensitive to moisture is to dispose these elements inside a protection casing and the rotor outside the protection casing and then to insert the rotation shaft through the protection casing, so that the rotor is positioned and the stator as well as the circuit board is protected. However, such fans require O-rings between the rotation shaft and the casing to achieve the waterproof effect. Under long time usage, the O-rings easily become fatigue and loose resilience, so that water is likely to permeate through the gap between the rotation shaft and the casing, and the fan is no longer waterproof. Moreover, the O-rings need to be replaced periodically, and the disassembly of the fan for such replacement is time-consuming and inconvenient.

In addition, the conventional fan is usually disposed inside the housing of the electronic device. Therefore, the heat is dissipated out of the housing or conducted to the surface of the housing by the heat sinks, heat pipes, and the like through air flow. However, such techniques usually need to enlarge the heat sink or increase the rotation speed of the fan. Consequently, it is difficult to control the device volume and makes the noise too loud or the cost too high.

Therefore, how to promote the convenience of assembly/disassembly and the efficiency of heat dissipation and to enhance the cleaning or waterproof functionality is very important to the fan design.

SUMMARY OF THE INVENTION

In view of the above problems, in one aspect, the invention provides a separable fan device, wherein the rotor unit is supported by the bearing support and the bearing support is detachably attached to the fan casing, so that the rotor unit and the stator unit can be readily assembled or disassembled.

In another aspect, the invention provides a waterproof fan device, wherein the stator unit and the rotor unit are disposed inside and outside the fan casing, respectively, and the bearing support attached to the solid casing supports the rotor unit, so that the casing can effectively achieve the waterproof effect to protect the stator and the circuit board inside the casing.

In an embodiment, the invention provides a fan device including a casing, a stator unit, a rotor unit, and a bearing support. The stator unit is disposed inside the casing. The rotor unit is disposed outside the casing corresponding to the stator unit and isolated from the stator unit by the casing. The rotor unit includes a rotation shaft, a bearing, a fan wheel, and a rotor. The bearing support partially shields the rotor unit and supports the rotor unit in a manner that the bearing or the rotation shaft is fixed to the bearing support, so that the fan wheel is driven to rotate with respect to the bearing support as the rotor rotates relative to the stator unit, wherein the bearing support is detachably connected to the casing, so that the rotor unit and the bearing support are removed together from the casing when the bearing support is removed from the casing.

In an embodiment, the fan device further includes a first magnetic piece and a second magnetic piece, wherein the first magnetic piece and the second magnetic piece are disposed on the bearing support and the casing, respectively. The bearing support is detachably connected to the casing by the magnetic attraction force generated between the first magnetic piece and the second magnetic piece.

In an embodiment, the casing has a groove; the bearing support has an end portion. The first magnetic piece and the second magnetic piece are disposed on the groove and the end portion, respectively.

In an embodiment, the bearing support has a first engaging portion; the casing has a second engaging portion detachably engaging with the first engaging portion, so that the bearing support is detachably connected to the casing. In one embodiment, the first engaging portion is one of a hook and a slot, and the second engaging portion is the other one of the hook and the slot.

In an embodiment, the casing has an accommodation cave; the bearing is inserted into the accommodation cave. The fan wheel and the rotor are disposed outside the accommodation cave.

In an embodiment, the fan wheel has a tubular portion extending into the accommodation cave. At least a portion of the bearing is located in the tubular portion and then into the accommodation cave.

In an embodiment, the bearing support has a positioning hole; the bearing is positioned in the positioning hole, so that the bearing is fixed to the bearing support and the portion of the bearing in the tubular portion does not contact the tubular portion.

In an embodiment, the rotation shaft penetrates through the bearing, so that one end of the rotation shaft is positioned on a top portion of the bearing, and the other end of the rotation shaft extends out of a bottom of the bearing to be positioned on the tubular portion.

In an embodiment, the bearing is positioned in the tubular portion, and the rotation shaft penetrates through the bearing, so that one end of the rotation shaft is positioned on a bottom of the bearing, and the other end of the rotation shaft extends out of a top portion of the bearing to be fixed to the bearing support.

In an embodiment, the fan device further includes an adhesive disposed in the positioning hole or the tubular portion to enhance the positioning of the bearing.

In an embodiment, the casing has an external surface, wherein the external surface is a wavy surface.

In an embodiment, the casing has a plurality of grooves on the external surface, wherein the grooves are arranged radially with the accommodation cave as a center to form the wavy surface.

In an embodiment, the casing has a plurality of grooves on the external surface, wherein the grooves are parallel to form the wavy surface.

In an embodiment, the bearing support is a support having a plurality of legs detachably connected to the casing, so that the bearing support is detachably connected to the casing.

In an embodiment, the stator unit includes a stator and a circuit board; the rotor is disposed corresponding to the stator.

In another aspect, the invention provides an electronic device, wherein the fan wheel is disposed outside the housing and a plurality of heat sinks are disposed on the external surface of the housing to guide the air flow generated by the fan wheel and enhance the heat dissipation effect.

In one embodiment, the invention provides an electronic device including a housing and a fan. The housing has a plurality of heat sinks disposed on an external surface of the housing. The fan includes a stator unit and a rotor unit, wherein the stator unit is disposed inside the housing; the rotor unit is disposed outside the housing corresponding to the stator unit. The rotor unit includes a fan wheel disposed on the housing, wherein the fan wheel and the plurality of heat sinks are on the same side of the housing.

In an embodiment, the fan further includes a bearing support; the rotor unit further includes a rotation shaft, a bearing and a rotor. The rotor unit is isolated from the stator unit by the housing. The bearing support partially shields the rotor unit and supports the rotor unit in a manner that the bearing or the rotation shaft is fixed to the bearing support, so that the fan wheel is driven to rotate with respect to the bearing support as the rotor rotates relative to the stator unit; the bearing support is detachably connected to the housing, so that the rotor unit and the bearing support are removed together from the casing when the bearing support is removed from the casing.

In an embodiment, the housing has a plurality of grooves on the external surface to form a wavy surface having a plurality of peak portions and a plurality of valley portions, wherein the plurality of peak portions serve as the heat sinks, and the plurality of grooves are arranged radially with the accommodation cave as a center.

In an embodiment, the housing has a plurality of grooves on the external surface to form a wavy surface having a plurality of peak portions and a plurality of valley portions; the plurality of peak portions serve as the heat sinks, and the plurality of grooves are parallel to each other.

In an embodiment, a portion of the external surface where the heat sinks are disposed is a solid surface without any hole. Each of the heat sinks has a recessed portion at a predetermined location. The fan wheel is at least partially received in the recessed portion, so that when the fan wheel rotates, an air flow flows externally to the external surface along a direction perpendicular to the external surface and then flows parallel to the external surface among the heat sinks.

DETAILED DESCRIPTION OF THE PREFERRED EMBODIMENT

The invention provides a fan device, particularly a separable fan device to promote the assembly/disassembly efficiency of the fan device or a waterproof fan device to promote the convenience of cleaning the fan device. Moreover, the invention also provides an electronic device having the fan device, wherein the housing of the electronic device has a plurality of heat sinks disposed thereon to guide the air flow generated by the fan wheel and to increase the heat dissipation efficiency by increasing the heat dissipation area. In embodiments of the present invention, the fan device is preferably applied to the image-forming apparatus, such as projector, but not limited thereto. In other embodiments, the fan device can be applied to portable devices or any electronic devices in need of effective heat dissipation or any electronic devices requiring easy assembly/disassembly or waterproof effect for cleaning. Hereinafter, embodiments of the fan device and the electronic device of the invention will be described in detail with reference to the drawings.

Figure 1A:
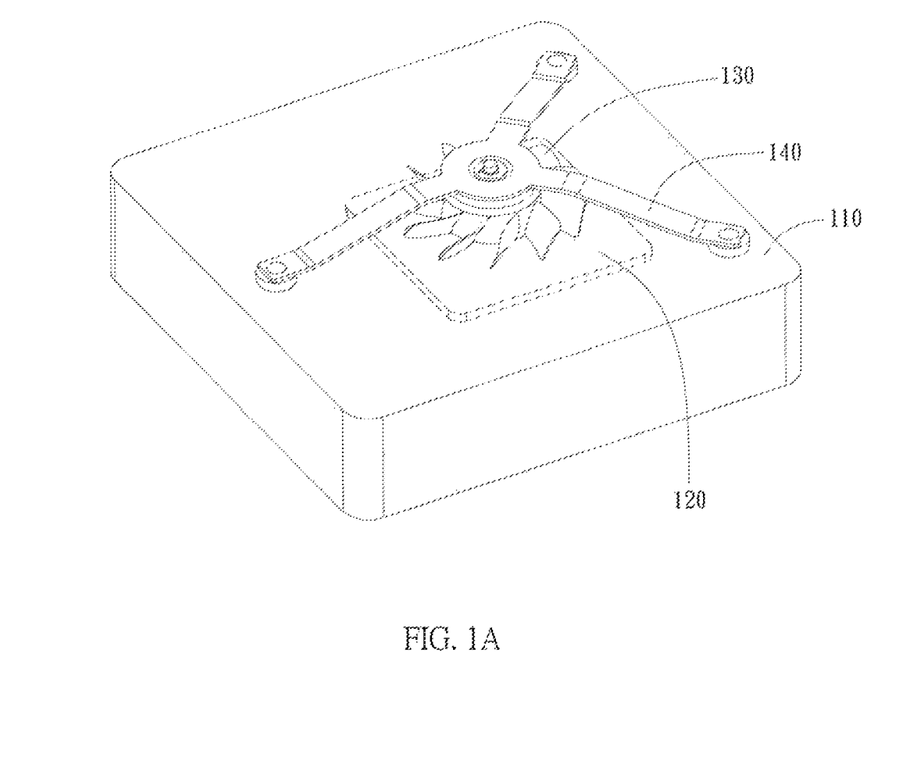
FIGS. 1A to 1C are respectively a perspective view, a partial exploded view, and a cross-sectional view of an embodiment of the fan device/electronic device of the invention.
Figure 1B:
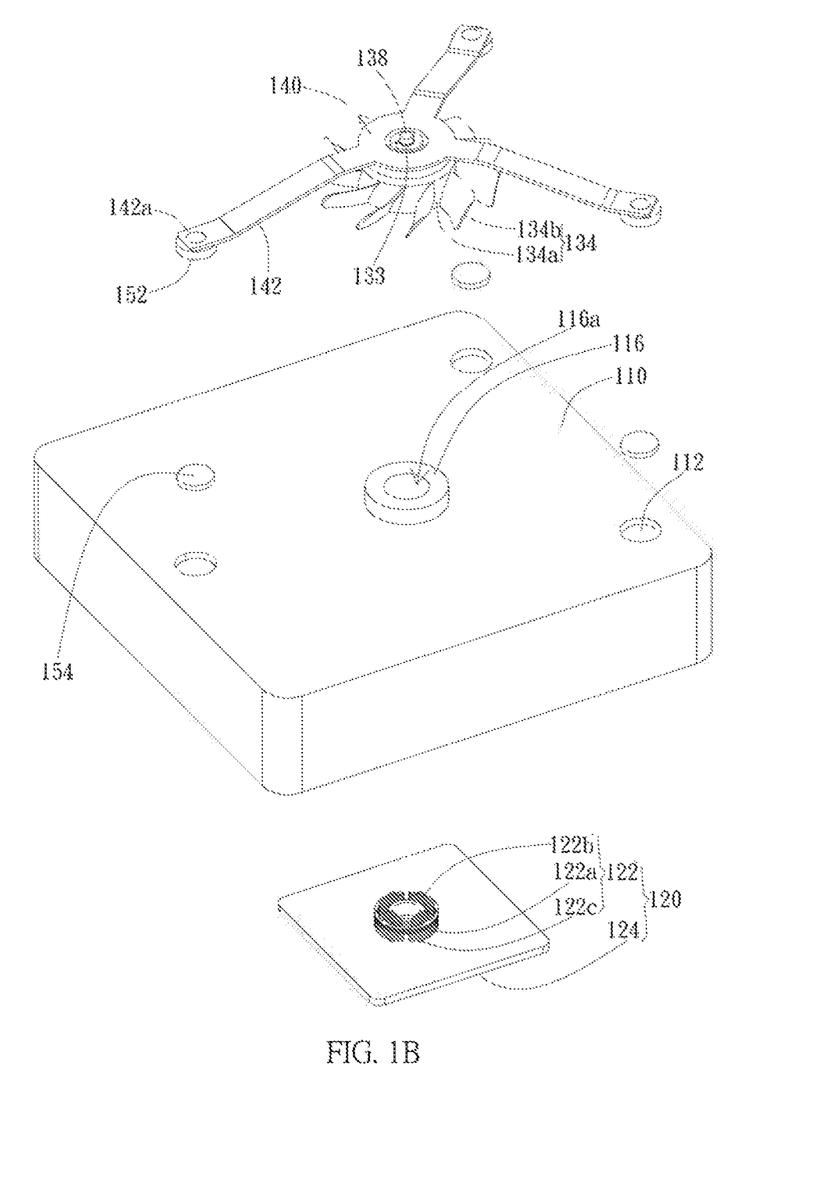
Figure 1C:
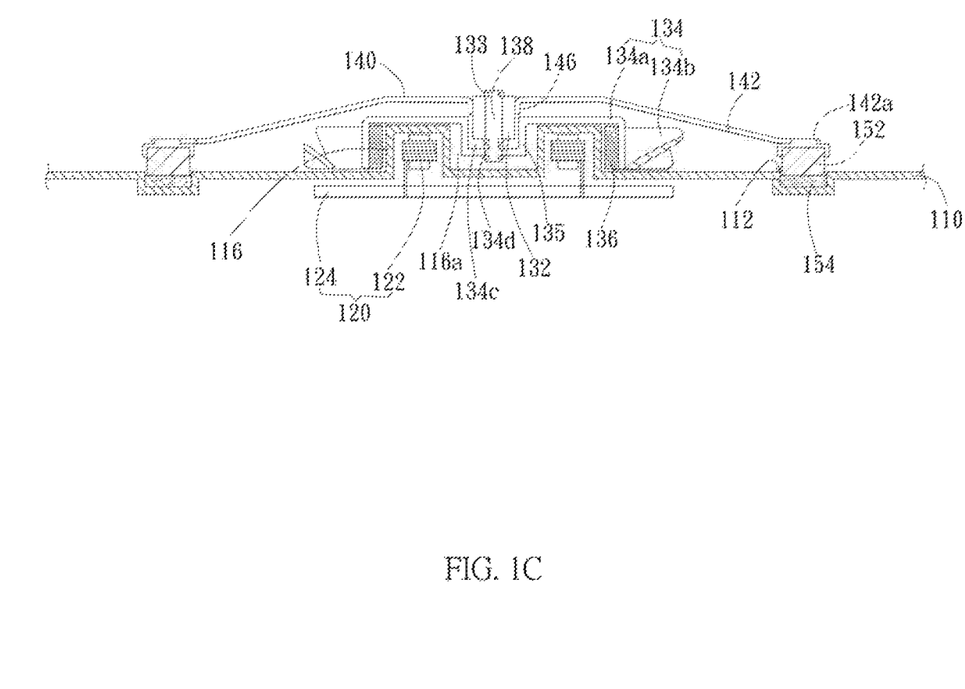

As shown in FIG. 1A to FIG. 1C, in an embodiment, the fan device of the invention includes a casing 110, a stator unit 120, a rotor unit 130, and a bearing support 140. The stator unit 120 is disposed inside the casing 110. The rotor unit 130 is disposed outside the casing 110 corresponding to the stator unit 120 and isolated from the stator unit 120 by the casing 110. Particularly, the rotor unit 130 is connected to the bearing support 140, and the bearing support 140 is detachably connected to the casing 110, so that the rotor unit 130 can be detachably positioned outside the casing 110 corresponding to the stator unit 120 due to the support of the bearing support 140. Accordingly, when the bearing support 140 is removed from the casing 110, the rotor unit 130 and the bearing support 140 can be removed together from the casing 110. In this embodiment, the portion of the casing 110 sandwiched between stator unit 120 and the rotor unit 130 is a solid portion without any through holes, so that the rotor unit 130 is substantially completely isolated from the stator unit 120 by the holeless portion. In an embodiment, when the fan device is independently in use, the casing 110 can be the fan casing, which has an inner space for accommodating the stator unit 120 while the rotor unit 130 and the bearing support 140 are detachably connected to the casing 110 and serve as external elements outside the fan casing. In another embodiment, when the fan device is applied to an electronic device, the casing 110 can be the outer housing of the electronic device, wherein the stator unit 120 is disposed inside the housing of the electronic device while the rotor unit 130 and the bearing support 140 are detachably disposed outside the housing of the electronic device. That is, when the fan device is independently in use, FIG. 1 is considered as showing an independent fan device and the casing 110 accommodates the stator unit 120 therein. When the fan device is applied to an electronic device, FIG. 1A is considered as showing the electronic device employing the fan device and the casing 110 accommodates the stator unit 120 and other functional elements or parts of the electronic device therein. Hereinafter, FIG. 1A is illustrated as the fan device and similar descriptions can be applied to the electronic device.

As shown in FIG. 1B and FIG. 1C, the stator unit 120 includes a stator 122 and a circuit board 124. The stator 122 can consist of a frame 122a, a plurality of coils 122b winding around the frame 122a, and a plurality of leads 122c. The stator 122 is electrically connected to the circuit board 124 by the leads 122c. It is noted that the stator 122 can be any suitable stator structure, which is controlled by the circuit board 124 to generate a magnetic field with the rotor 136 of the rotor unit 130 (shown in FIG. 1C and FIG. 1D) to cause rotations of the rotor 136.

Figure 1D:
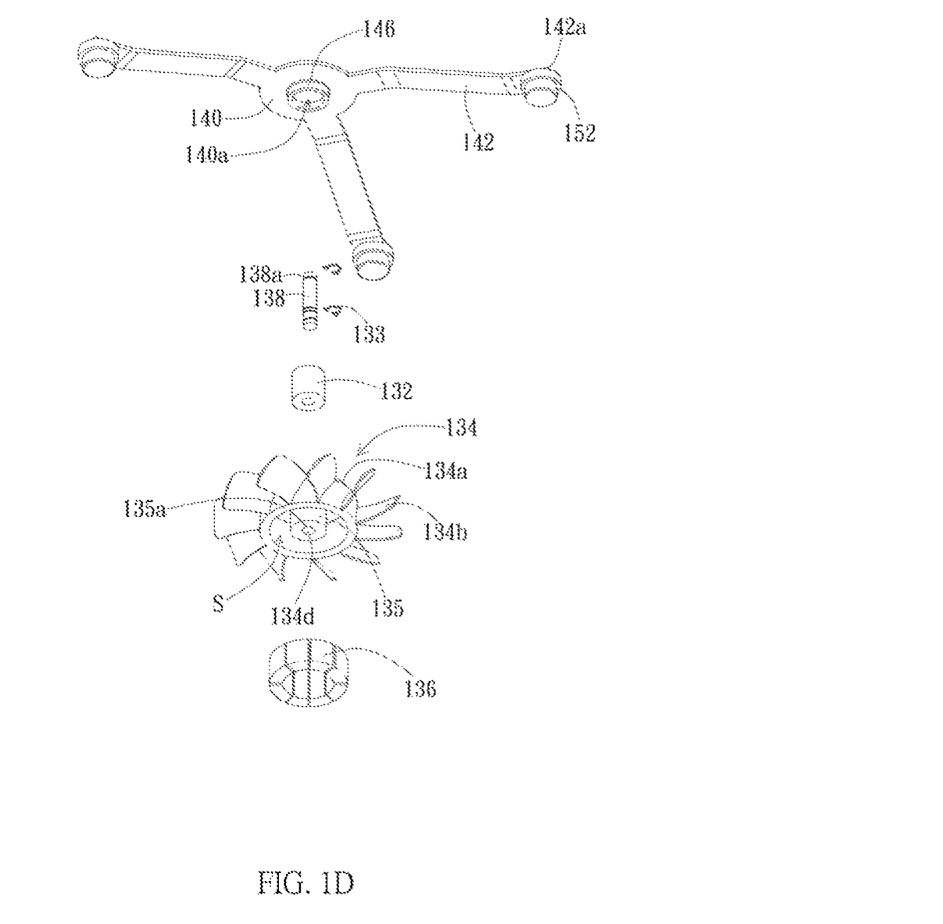
FIG. 1D is an exploded view of the rotor unit in FIG. 1B.

As shown in FIG. 1C and FIG. 1D, the rotor unit 130 includes a bearing 132, a fan wheel 134, a rotor 136, and a rotation shaft 138. The fan wheel 134 includes a wheel case 134a and a plurality of fan leaves 134b extending outward from the side surface of the wheel case 134a. The wheel case 134a has a cap-like shape for accommodating the rotor 136 inside the wheel case 134a. That is, the wheel case 134a has a space S for accommodating the rotor 136 on the inner side. The rotor 136 is a magnetic piece. In this embodiment, the rotor 136 preferably consists of a plurality of magnets, and the magnets can be attached onto the inner surface of the wheel case 134a by adhesives or fixed on the inner surface of the wheel case 134a by any suitable engaging mechanism. The rotation shaft 138 is rotatably connected to the bearing 132 and the bearing support 140 and rotates along with the fan wheel 134. In this embodiment, the fan wheel 134 has a bearing trough 134c and a shaft hole 134d, wherein the bearing trough 134c communicates with the shaft hole 134d, and the bearing trough 134c and the shaft hole 134d are preferably formed on the central location of the wheel case 134a. Particularly, the wheel case 134a has a tubular portion 135, which is recessed from the surface of the wheel case 134a and extends toward the inner side. The bearing trough 134c and the shaft hole 134d are tube holes at different portions of the tubular portion 135. For example, the shaft hole 134d is formed at the distal end of the tubular portion 135, and the bearing trough 134c is closer to the bottom of the wheel case 134a. The diameters of the bearing trough 134c and the shaft hole 134d are designed based on the outer diameters of the bearing 132 and the rotation shaft 138. The diameter of the bearing trough 134c is larger than the diameter of the shaft hole 134d, wherein the diameter of the bearing trough 134c is larger than the outer diameter of the bearing 132, and the diameter of the shaft hole 134d is substantially equal to the diameter of the rotation shaft 138. In this embodiment, the tubular portion 135 has a hollow portion extending along the tubular body to serve as the bearing trough 134c, and the tubular portion 135 has a bottom surface 135a at its distal end, wherein the bottom surface 135a is opened with a through hole to serve as the shaft hole 134d. In another embodiment (not shown), the tubular portion 135 may have a hole with wider top and narrower bottom, wherein the wider portion of the hole serves as the bearing trough 134c and the narrower portion of the hole serves as the shaft hole 134d.

As shown in FIG. 1C and FIG. 1D, the bearing support 140 has a positioning portion 146 for positioning the bearing 132. Particularly, the positioning portion 146 is a protruding tube that protrudes from the bottom surface of the bearing support 140 and has a positioning hole 140a for receiving the bearing 132. The diameter of the positioning hole 140a is preferably substantially equal to the bearing 132, so that the outer surface of the bearing 132 engages with the inner surface of the positioning hole 140a of the positioning portion 146 to position or fix the bearing 132 on the bearing support 140. When the bearing support 140 is detachably connected to the casing 110, the bearing 132 is supported by the bearing support 140 due to the engagement of the positioning portion 146 and the bearing 132, and the bearing 132 is inserted into the bearing trough 134c of the tubular portion 135 of the fan wheel 134 without contacting the inner surface of the bearing trough 134c. The rotation shaft 138 penetrates through the bearing 132, so that one end of the rotation shaft 138 protrudes from the bearing 132 by a certain distance into the shaft hole 134d and extends out of the tubular portion 135 to be positioned or fixed on the bottom surface 135a. The other end of the rotation shaft 138 penetrates through the bearing 132 and is positioned on a top portion of the bearing 132. That is, the bearing 132 is positioned on the positioning portion 146 of the bearing support 140 without direct contacting the fan wheel 134, and the rotation shaft 138 penetrates through the bearing 132 and the fan wheel 134, so that two ends of the rotation shaft 138 are respectively positioned on the bearing 132 and the fan wheel 134. As such, the bearing 132 partially extends into the bearing trough 134c of the fan wheel 134 and is supported by the bearing support 140. It is noted that the bearing 132, the rotation shaft 138, and the fan wheel 134 (optionally with suitable gaskets) can be positioned or fixed by a positioning unit 133, such as C-shaped ring, so that the fan wheel 134 and the rotation shaft 138 can rotate with respect to the bearing 132. For example, the rotation shaft 138 can have a positioning groove 138a, and the positioning unit 133 (e.g. C-shaped ring) is fitted in the positioning groove 138a of the rotation shaft 138, so that the bearing 132 is positioned relative to the bearing trough 134c of the fan wheel 134 by the rotation shaft 138 and does not contact the inner wall of the bearing trough 134c.

As shown in FIG. 1B and FIG. 1C, the bearing support 140 is detachably connected to the casing 110. The bearing support 140 partially shields the rotor unit 130 and supports the bearing 132 in a manner that the bearing 132 is fixed to the bearing support 140, so that the fan wheel 134 is driven to rotate with respect to the bearing support 140 and the casing 110 and generate air flow as the rotor 136 rotates relative to the stator 122 of the stator unit 120. Particularly, the bearing support 140 is preferably a support having a plurality of legs 142. The legs 142 are detachably connected to the casing 110, so that the bearing support 140 can be detachably connected to the casing 110. The legs 142 are preferably evenly disposed on the bearing support 140, so that the force acted on the bearing support 140 can be evenly distributed. That is, the legs 142 preferably have the same extension length and the same shape, and adjacent legs 142 preferably include the same central angle with respect to the center of the bearing support 140. In this embodiment, the bearing support 140 is a support with three legs 142, wherein the three legs 142 are disposed along the circumferential direction by about 120 degrees, but not limited thereto. The positioning portion 146 for positioning the bearing 132 is preferably located at the center of the bearing support 140 (i.e. a location where the three legs 142 intersect). The bearing support 140 can be detachably connected to the casing 110 by any suitable engaging mechanism or magnetic force. In this embodiment, the fan device further includes a first magnetic piece 152 and a second magnetic piece 154, wherein the first magnetic piece 152 and the second magnetic piece 154 are disposed on the bearing support 140 and the casing 110, respectively. As such, the bearing support 140 can be detachably connected to the casing 110 by the magnetic attraction force between the first magnetic piece 152 and the second magnetic piece 154. For example, the bearing support 140 has an end portion 142a, such as the distal end of the leg 142. The casing 110 has a groove 112, which is disposed corresponding to the end portion 142a of the bearing support 140. The first magnetic piece 152 is disposed on the end portion 142a of the leg 142 while the second magnetic piece 154 is disposed in the groove 112 of the casing 110, so that the magnetic attraction force between the first magnetic piece 152 and the second magnetic piece 154 allows the bearing support 140 to be detachably connected to the casing 110. The first magnetic piece 152 and the second magnetic piece 154 can be a combination of magnet and iron or both magnets.

Figure 2:
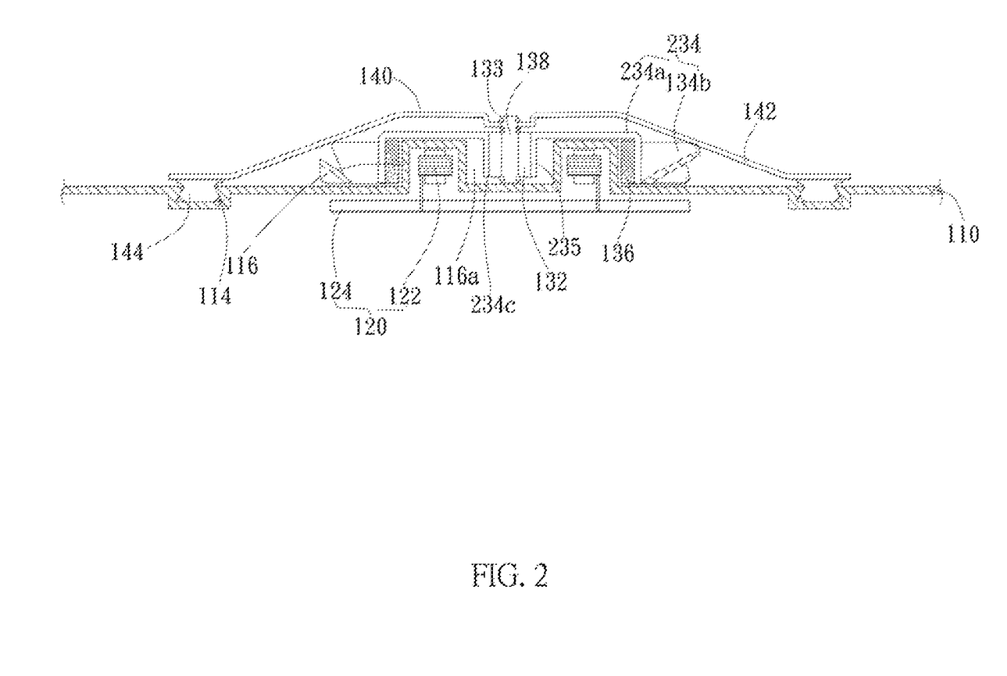
FIG. 2 is a cross-sectional view of another embodiment of the fan device/electronic device of the invention.

In another embodiment, as shown in FIG. 2, the bearing support 140 has a first engaging portion 144, and the casing 110 has a second engaging portion 114. The second engaging portion 114 can detachably engage with the first engaging portion 144, so that the bearing support 140 can be detachably connected to the casing 110. The first engaging portion 144 can be one of a hook and a slot, and the second engaging portion 114 is the other one of the hook and the slot. For example, the first engaging portion 144 is a bump-shaped hook disposed on the distal end of the leg 142 of the bearing support 140, and the second engaging portion 114 is a blind hole or a groove formed on the surface of the casing 110, wherein the blind hole or the groove preferably has a smaller top portion for engaging with a neck portion of the bump-shaped hook. In another embodiment, the first engaging portion 144 can be formed of deformable material, such as rubber, to promote the convenience of engagement/disengagement.

It is noted that the bearing support may have two or more than two legs according to practical applications, but not limited thereto. In other embodiments, the bearing support can be formed without any legs. For example, in another embodiment (not shown), the bearing support can be a cap-like support with a plurality of through holes, so that the bearing support can be screwed to the casing. For example, the cap-like bearing support may have an internal thread while the engaging portion of the casing has an external thread, so that the bearing support can be screwed to the casing. Moreover, in the embodiment of FIG. 2, the bearing support 140 engages with the casing 110 along a direction vertical to the surface of the casing 110, i.e. along the normal to the surface of the casing 110, but not limited thereto. In another embodiment, the bearing support 140 may engage with the casing 110 along a direction parallel to the surface of the casing 110. For example, the first engaging portion of the bearing support can be a protrusion protruding from the circumferential direction while the second engaging portion of the casing is a corresponding groove, so that the bearing support can engage with the casing along the circumferential direction to achieve the detachable connection.

When the bearing support 140 is detachably connected to the casing 110, the rotor unit 130 supported by the bearing support 140 is disposed outside the casing 110 corresponding to the stator unit 120. Particularly, as shown in FIG. 1B and FIG. 1C, the casing 110 has an accommodation cave 116a for accommodating the bearing 132. In this embodiment, the casing 110 has a raised portion 116, and the accommodation cave 116a is a recessed portion which is recessed from the surface of the raised portion 116. The stator 122 is disposed corresponding to the raised portion 116. For example, the surface of the raised portion 116 is recessed toward the stator 122 and extends into the center of the frame 122a of the stator 122 to form a blind hole as the accommodation cave 116a. When the bearing support 140 is detachably connected to the casing 110, the bearing 132 is inserted into the accommodation cave 116a, and the fan wheel 134 (e.g. the fan leaves 134b) and the rotor 136 are disposed outside the accommodation cave 116a. Particularly, when the bearing support 140 is detachably connected to the casing 110, the tubular portion 135 that protrudes from the bottom surface of the wheel case 134a as well as the bearing 132 positioned therein extends into the accommodation cave 116a, and the wheel case 134a covers the raised portion 116, so that the rotor 136 is disposed outside the raised portion 116 corresponding to the stator 122. It is noted that as the wheel case 134a covers the raised portion 116, a small gap is preferably maintained between the wheel case 134a and the raised portion 116 of the casing 110 to facilitate the rotation of the fan wheel 134 relative to the casing 110. When the stator 122 is controlled by the circuit board 124 to generate the magnetic field with the rotor 136 and the rotor 136 rotates relative to the stator 122, the rotor 136 drives the fan wheel 134 and the rotation shaft 138 to rotate relative to the bearing 132. As such, the rotation of the fan leaves 134b generates air flow.

Moreover, the rotor unit can be supported by the bearing support in different ways. That is, the bearing, the fan wheel, the rotation shaft, and the bearing support can be connected or positioned in a different way. In another embodiment, as shown in FIG. 2, the bearing support 140 supports the rotor unit 120 in a manner that the rotation shaft 138 is fixed to the bearing support 140, so that the bearing 132 is indirectly connected to the bearing support 140 by means of the rotation shaft 138 and the positioning unit 133. The bearing 132 is positioned on the wheel case 234a of the fan wheel 234. One end of the rotation shaft 138 is positioned on the bottom surface of the bearing 132, and the other end of the rotation shaft 138 penetrates through the bearing 132 and protrudes above the top surface of wheel case 234a to be positioned or fixed on the top surface of the bearing support 140. For example, the wheel case 234a has a tubular portion 235 that extends downward from the wheel case 234a, and the tubular portion 235 has a bearing hole 234c for receiving the bearing 132. That is, the diameter of the bearing hole 234c is preferably substantially equal to the diameter of the bearing 132, so that the outer surface of the bearing 132 engages with the inner surface of the bearing hole 234c of the tubular portion 235 to position the bearing 132 on the wheel case 234. When the bearing support 140 is detachably connected to the casing 110, the bearing 132 is fitted in the tubular portion 235 to be positioned on the fan wheel 234; the rotation shaft 138 penetrates through the bearing 132 in a manner that one end of the rotation shaft 138 is positioned on the bottom surface of the bearing 132 and the other end of the rotation shaft 138 protrudes from the top surface of the bearing 132 and extends out of the bearing support 140 by a certain distance to be positioned on the top surface of the bearing support 140. That is, the bearing 132 is positioned in the tubular portion 235 of the fan wheel 234, and two ends of the rotation shaft 138 are positioned on the bearing 132 and the bearing support 140, respectively. Similarly, the bearing 132, the rotation shaft 138, the fan wheel 134, and the bearing support 140 (optionally with suitable gaskets) can be positioned by the positioning unit 133, such as C-shaped ring, so that the fan wheel 134 and the bearing 132 can rotate with respect to the rotation shaft 138 and the bearing support 140 as the rotor 136 rotates relative to the stator unit 120.

As shown in FIG. 2, when the bearing support 140 is detachably connected to the casing 110, the rotor unit 130 supported by the bearing support 140 is disposed outside the casing 110 corresponding to the stator unit 120 and can be removed from the casing 110 together with the bearing support 140 as the bearing support 140 is removed from the casing 110. Specifically, when the bearing support 140 is detachably connected to the casing 110, the tubular portion 235 that protrudes from the bottom of the wheel case 234a as well as the bearing 132 embedded therein extends into the accommodation cave 116a, and the wheel case 234a covers the raised portion 116, so that a gap exists between the wheel case 234a and the raised portion 116 of the casing 110. When the stator 122 is controlled by the circuit board 124 to generate magnetic field with the rotor 136 and the rotor 136 rotates relative to the stator 122, the rotor 136 drives the fan wheel 134 and the bearing 132 to rotate relative to the rotation shaft 138. As such, the rotation of the fan leaves 134b generates air flow.

It is noted that the rotation shaft is illustrated as a separate element in the above embodiments; however, in other embodiments, the rotation shaft can be integrated with the bearing support or the fan wheel. For example, in the embodiment of FIG. 1A to FIG. 1C, the rotation shaft 138 can be integrated with the wheel case 134 by molding, so that the rotation shaft 138 serves as a post of the fan wheel 134, which protrudes from the center bottom of the tubular portion 135 toward the bearing support 140 and becomes an integrated portion of the fan wheel 134. Alternatively, in the embodiment of FIG. 2, the rotation shaft 138 can be integrated with the bearing support 140 by molding, so that the rotation shaft 138 serves as a post of the bearing support 140, which protrudes from the center bottom of the bearing support 140 toward the bearing hole 234c of the fan wheel 234 and becomes an integrated portion of the bearing support 140.

Moreover, in the embodiments, the bearing is positioned on the bearing support or the fan wheel by engagement of its outer surface with the positioning portion or the tubular portion, but not limited thereto. In another embodiment, the coupling mechanism of the bearing with the positioning portion or the tubular portion can be modified to enhance the stability of connection. For example, adhesives can be coated in the positioning hole 140a of FIG. 1A to FIG. 1C, so that the bearing 132 is adhered to the positioning portion 146 of the bearing support 140. Alternatively, adhesives can be coated in the bearing hole 234c of FIG. 2, so that the bearing 132 is adhered to the tubular portion 135 of the fan wheel 234.

Figure 3A:
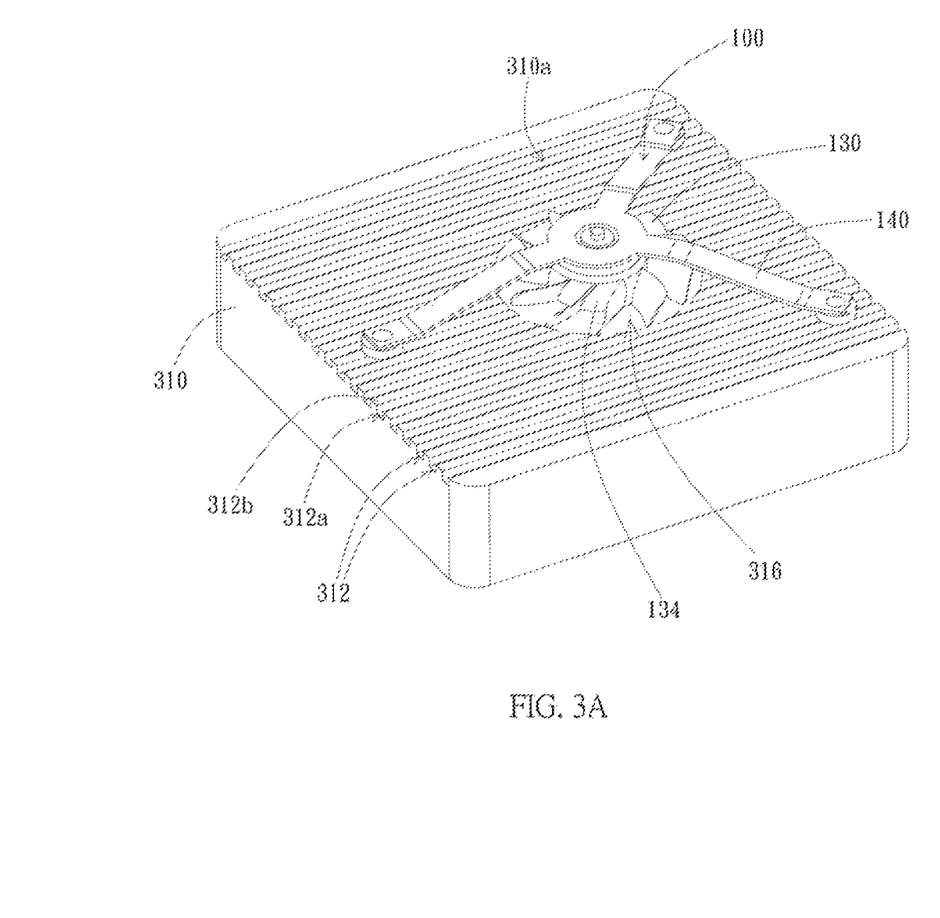
FIGS. 3A and 3B are schematic views of embodiments of the fan device/electronic device having different heat sink arrangement.
Figure 3B:
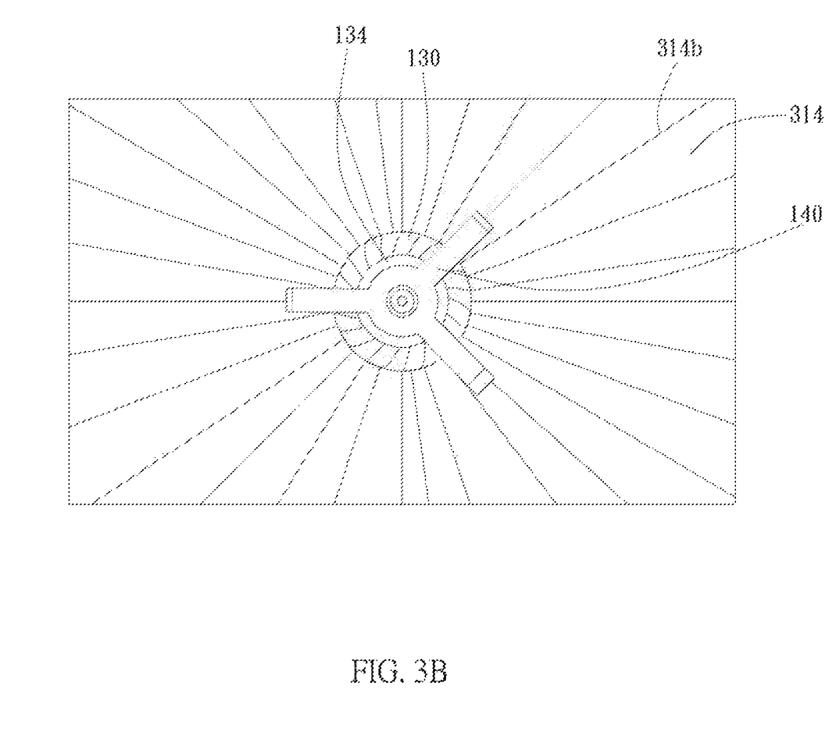

Furthermore, a plurality of heat sinks can be disposed on the external surface of the casing, so that the external surface becomes a wavy surface to increase the heat dissipation area. In an embodiment, as shown in FIG. 3A, a plurality of grooves 312 are formed on the external surface 310a of the casing 310, wherein the plurality of grooves 312 are disposed in parallel to form the wavy surface. Particularly, the casing 310 has a plurality of grooves 312 on the external surface 310a to form the wavy surface having a plurality of valley portions 312a and a plurality of peak portions 312b. The plurality of peak portions 312b serve as the heat sinks, and the plurality of grooves 312 are parallel to each other so that the heat sinks are disposed parallel. In other words, the bottom of the groove 312 serves as the valley portion 312a, and the portion of the casing 310 that is raised with respect to the valley portion 312a serves as the peak portion 312b. In another embodiment, as shown in FIG. 3B, the plurality of grooves 314 are arranged radially with the accommodation cave 116a (or the fan wheel 134a of the rotor unit 130) as a center to form the wavy surface. Similarly, the casing 310 has the plurality of grooves 314 on the external surface to form the wavy surface having a plurality of peak portions 314b and a plurality of valley portions, wherein the plurality of peak portions 314b serve as the heat sinks. It is noted that the parallel grooves in FIG. 3A can be formed by aluminum extrusion at low production cost, but the air flow in the direction vertical to the extension direction of the groove is less satisfied. The radial grooves in FIG. 3B can be formed by extrusion or lathe work and create a better heat dissipation effect since the air flow direction is consistent with the wavy direction.

Figure 4A:
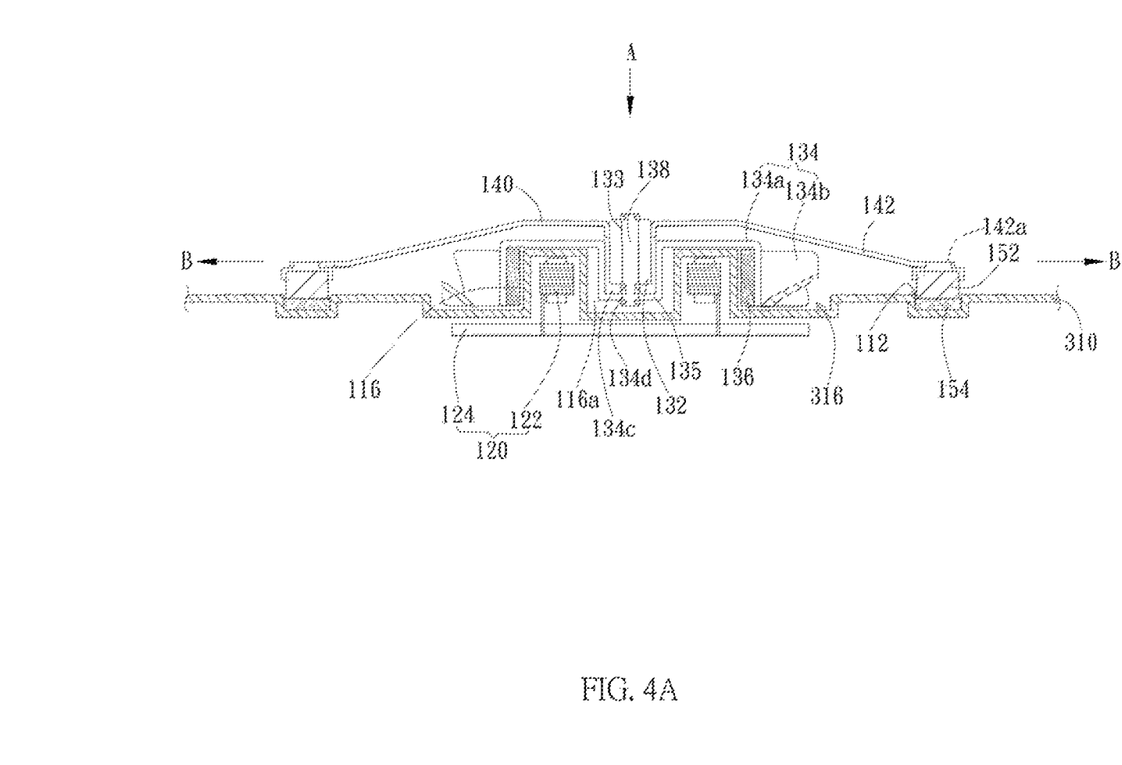
FIG. 4A is a cross-sectional view of another embodiment of the fan device/electronic device of the invention.

Moreover, as described above, when the fan device is applied to an electronic device, the casing 110 can be the outer housing of the electronic device. As shown in FIG. 3A and FIG. 4A, the electronic device includes the outer housing 310 and the fan device 100, wherein the outer housing 310 has a plurality of heat sinks 312b on the external surface 310a, and the fan device 100 can be constructed as shown in FIG. 1C or FIG. 2. Taking the fan device of FIG. 1C as an example, the stator unit 120 is disposed inside the housing 310, and the rotor unit 130 is disposed outside the housing 310 corresponding to the stator unit 120. The rotor unit 130 includes the fan wheel 134 and the rotor 136, wherein the fan wheel 134 is disposed on the housing 310, and the fan wheel 134 and the plurality of heat sinks 312b are on the same side of the housing 310. It is noted in this embodiment, the stator unit 120, the rotor unit 130, and the bearing support 140 are arranged similar to those shown in FIG. 1C and will not elaborated hereinafter. In this embodiment, the portion of the housing 310 where the heat sinks 312b are disposed is preferably a solid portion, and a recessed portion 316 is formed among the heat sinks 312b. The fan wheel 134 is at least partially received in the recessed portion 316. As such, when the fan wheel 134 rotates, the air flows along the direction vertical to the surface 310a of the housing 310 toward the external surface 310a (i.e. along the direction A) and then flows along the direction parallel to the surface 310a between the heat sinks 312b (i.e. along the direction B).

Figure 4B:
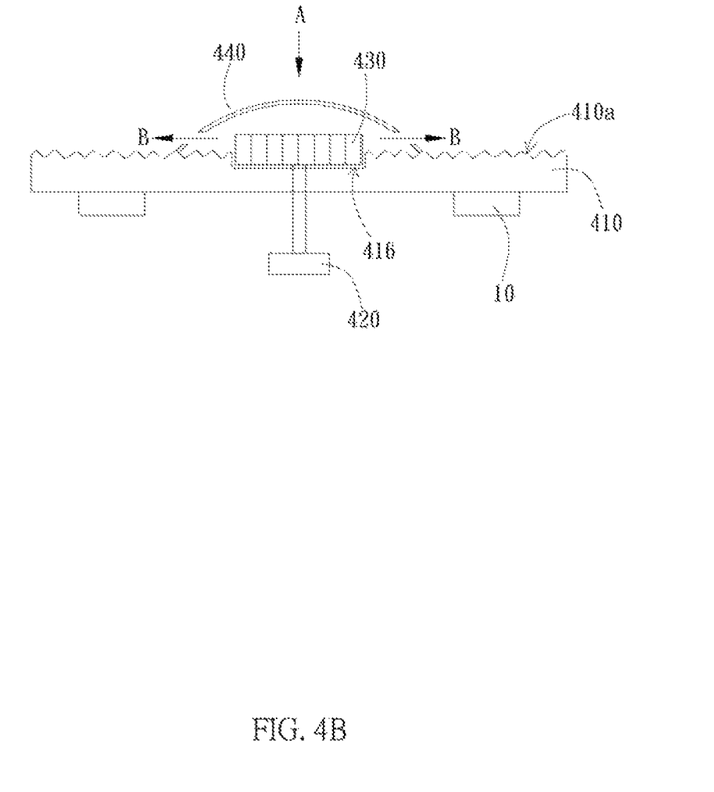
FIG. 4B is a cross-sectional view of another embodiment of the electronic device having heat sink on its external surface and a fan of different configuration.

Moreover, the technique of disposing the heat sinks on the external surface of the outer housing can be applied to any electronic device with the fan wheel disposed outside the housing, so that the heat generated by the heat source and transferred to the housing can be dissipated by the cool air flow generated by the fan device. As shown in FIG. 4B, in another embodiment, the electronic device is employed with a fan device of different configuration, wherein the fan device has the fan wheel 430 disposed outside the housing 410, and the motor 420 constructed by the stator, the rotor, and the circuit board is disposed inside the housing 410. In this embodiment, the external surface 410a of the housing 410 is a way surface by disposing a plurality of heat sinks to increase the heat dissipation area. A protection cover 440 shields at least a portion of the fan wheel 430 to prevent mistouching of the fan wheel 430 in rotation. The fan wheel 430 is preferably at least partially received in the recessed portion 416 of the housing 410, so that when the fan wheel 430 rotates, the air flows along the direction vertical to the surface 410a of the housing 410 toward the external surface 410a (i.e. along the direction A) and then flows along the direction parallel to the wavy surface 410a (i.e. along the direction B). It is noted that the fan device is preferably disposed on the surface of the electronic device that has no display or operation button disposed or close to the hot zone (e.g. close to the heat source 10) to achieve a better heat dissipation effect.

Compared to the prior art, the fan device or the electronic device of the present invention has the bearing positioned on the bearing support or the fan wheel, so that the stator unit and the rotor unit can be isolated from each other by a holeless portion of the casing to achieve the waterproof effect and the convenience of cleaning. Moreover, the fan device or the electronic device of the present invention has the rotor unit supported by the bearing support that can be detachably connected to the casing to facilitate the assembly/disassembly process of the rotor unit when replacement or cleaning is performed. In addition, compared to the conventional technique of disposing the fan wheel inside the casing, the present invention has the features of disposing the fan wheel outside the casing and arranging the external surface of the casing as a way surface to serve as the heat sinks that increases the contact area of the external surface with ambient environment to effectively dissipate the heat from the external surface by direct contact with low temperature air flow, and greatly promote the heat dissipation efficiency.

Although the preferred embodiments of present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. An electronic device, comprising:
   a housing having a plurality of heat sinks disposed on an external surface of the housing; and
   a fan, comprising:
      a stator unit disposed inside the housing; and
      a rotor unit disposed outside the housing corresponding to the stator unit, the rotor unit comprising a fan wheel, wherein the rotor unit is isolated from the stator unit by the housing, the fan wheel is disposed on the housing, and the fan wheel and the plurality of heat sinks are on the same side of the housing.

2. The electronic device of claim 1, wherein the fan further comprises a bearing support; the rotor unit further comprises a rotation shaft, a bearing and a rotor; the bearing support partially shields the rotor unit and supports the rotor unit in a manner that the bearing or the rotation shaft is fixed to the bearing support, so that the fan wheel is driven to rotate with respect to the bearing support as the rotor rotates relative to the stator unit; the bearing support is detachably connected to the housing, so that the rotor unit and the bearing support are removed together from the casing when the bearing support is removed from the casing.

3. The electronic device of claim 2, wherein the fan further comprises a first magnetic piece and a second magnetic piece; the first magnetic piece and the second magnetic piece are disposed on the bearing support and the housing, respectively; the bearing support is detachably connected to the housing by the magnetic attraction force generated between the first magnetic piece and the second magnetic piece.

4. The electronic device of claim 3, wherein the housing has a groove, the bearing support has an end portion, and the first magnetic piece and the second magnetic piece are disposed on the groove and the end portion, respectively.

5. The electronic device of claim 2, wherein the bearing support has a first engaging portion, and the casing has a second engaging portion detachably engaging with the first engaging portion, so that the bearing support is detachably connected to the casing.

6. The electronic device of claim 5, wherein the first engaging portion is one of a hook and a slot, and the second engaging portion is the other one of the hook and the slot.

7. The electronic device of claim 2, wherein the housing has an accommodation cave, the bearing is inserted into the accommodation cave, and the fan wheel and the rotor are disposed outside the accommodation cave.

8. The electronic device of claim 7, wherein the fan wheel has a tubular portion, the tubular portion extends into the accommodation cave, and at least a portion of the bearing is located in the tubular portion and then into the accommodation cave.

9. The electronic device of claim 8, wherein the bearing support has a positioning hole, and the bearing is positioned in the positioning hole, so that the bearing is fixed to the bearing support and the portion of the bearing in the tubular portion does not contact the tubular portion.

10. The electronic device of claim 9, wherein the rotation shaft penetrates through the bearing, so that one end of the rotation shaft is positioned on a top portion of the bearing, and the other end of the rotation shaft extends out of a bottom of the bearing to be positioned on the tubular portion.

11. The electronic device of claim 8, wherein the bearing is positioned in the tubular portion, and the rotation shaft penetrates through the bearing, so that one end of the rotation shaft is positioned on a bottom of the bearing, and the other end of the rotation shaft extends out of a top portion of the bearing to be fixed to the bearing support.

12. The electronic device of claim 9, further comprising an adhesive disposed in the positioning hole or the tubular portion to enhance the positioning of the bearing.

13. The electronic device of claim 7, wherein the external surface is a wavy surface.

14. The electronic device of claim 13, wherein the housing has a plurality of grooves on the external surface to form the wavy surface having a plurality of peak portions and a plurality of valley portions; the plurality of peak portions serve as the heat sinks, and the plurality of grooves are arranged radially with the accommodation cave as a center.

15. The electronic device of claim 13, wherein the housing has a plurality of grooves on the external surface to form the wavy surface having a plurality of peak portions and a plurality of valley portions; the plurality of peak portions serve as the heat sinks, and the plurality of grooves are parallel to each other.

16. The electronic device of claim 2, wherein the bearing support is a support having a plurality of legs detachably connected to the housing, so that the bearing support is detachably connected to the casing.

17. The electronic device of claim 2, wherein the stator unit comprises a stator and a circuit board, and the rotor corresponds to the stator.

18. The electronic device of claim 1, wherein a portion of the external surface where the heat sinks are disposed is a solid surface without any hole, the housing has a recessed portion among the heat sinks; the fan wheel is at least partially received in the recessed portion, so that when the fan wheel rotates, an air flow flows externally to the external surface along a direction perpendicular to the external surface and then flows parallel to the external surface among the heat sinks.

* * * * *